United States Patent
Bertin et al.

(10) Patent No.: US 6,346,846 B1
(45) Date of Patent: Feb. 12, 2002

(54) METHODS AND APPARATUS FOR BLOWING AND SENSING ANTIFUSES

(75) Inventors: Claude L. Bertin, South Burlington; John A. Fifield, Underhill; Russell J. Houghton; William R. Tonti, both of Essex Junction; Nicholas M. Van Heel, Burlington, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/466,479

(22) Filed: Dec. 17, 1999

(51) Int. Cl.$^7$ .......................... H01H 37/76; H01H 85/00
(52) U.S. Cl. ..................................................... 327/525
(58) Field of Search ........................ 327/525; 365/225.7, 365/203, 204, 207, 96; 326/38

(56) References Cited

U.S. PATENT DOCUMENTS

| | | | |
|---|---|---|---|
| 4,354,217 A | 10/1982 | Mahon | 361/104 |
| 4,689,494 A | * 8/1987 | Chen et al. | 327/525 |
| 4,716,547 A | 12/1987 | Baskett et al. | 365/96 |
| 4,727,514 A | 2/1988 | Bhuva et al. | 365/104 |
| 4,733,168 A | 3/1988 | Blankenship et al. | 324/73 R |
| 4,853,628 A | 8/1989 | Gouldsberry et al. | 324/158 R |
| 5,324,681 A | 6/1994 | Lowrey et al. | 437/52 |
| 5,404,049 A | 4/1995 | Canada et al. | 327/525 |
| 5,418,487 A | 5/1995 | Armstrong, II | 327/525 |
| 5,521,871 A | 5/1996 | Choi | 365/189.11 |
| 5,657,280 A | 8/1997 | Shin et al. | 365/200 |
| 5,684,732 A | 11/1997 | Sako | 365/96 |
| 5,706,238 A | 1/1998 | Cutter et al. | 365/225.7 |
| 5,789,970 A | 8/1998 | Denham | 327/525 |
| 5,815,429 A | 9/1998 | Sher et al. | 365/96 |
| 5,838,076 A | * 11/1998 | Zarrabian et al. | 327/525 |
| 5,867,055 A | * 2/1999 | Asaumi et al. | 327/525 |
| 6,088,282 A | * 7/2000 | Loughmiller et al. | 365/225.7 |
| RE36,952 E | * 11/2000 | Zagar et al. | 326/44 |

* cited by examiner

*Primary Examiner*—My-Trang Nu Ton
(74) *Attorney, Agent, or Firm*—Dugan & Dugan; Kelly M. Reynolds; Robert A. Walsh

(57) ABSTRACT

Methods and apparatus for blowing and sensing antifuses are provided. Specifically, in a first aspect, a method is provided for changing the state of one of a plurality of antifuses by selecting one of the bank of antifuses and applying a high voltage to change the state of the selected antifuse. In second and third aspects, apparatus are provided for performing the method of the first aspect. In a fourth aspect, a method is provided for boosting a voltage that includes the steps of generating a first voltage within a first stage storage mechanism of a first stage voltage booster circuit, generating a second voltage equaling about twice the first voltage within a first and a second, second stage storage mechanism of a second stage voltage booster circuit, and generating about thrice the first voltage based on the second voltage of the second stage voltage booster circuit. In a fifth aspect, apparatus are provided for performing the method of the fourth aspect.

34 Claims, 11 Drawing Sheets

METHODS AND APPARATUS FOR BLOWING AND SENSING ANTIFUSES

CROSS-REFERENCE TO RELATED APPLICATIONS

The present application is related to commonly assigned U.S. patent application Ser. No. 09/466,495, filed on even date herewith titled ("ANTIFUSES AND METHODS FOR FORMING THE SAME") which is hereby incorporated by reference herein in its entirety.

FIELD OF THE INVENTION

The present invention relates to semiconductor integrated circuits and more specifically to methods and apparatus for blowing and sensing antifuses.

BACKGROUND OF THE INVENTION

To increase device yield, semiconductor integrated circuits such as DRAM and SRAM memories employ redundant circuitry that allows the integrated circuits to function despite the presence of one or more manufacturing or other defects (e.g., by employing the redundant circuitry rather than the original, defective circuitry). For example, conventional DRAM and SRAM memories often use laser fuse blow techniques as part of their redundancy scheme wherein redundant circuitry may be employed in place of defective circuitry by blowing one or more fuses with a laser beam.

While laser fuse blow techniques improve device yield, several problems remain. Laser fuse blow techniques must be performed at the wafer level and thus are time consuming and costly. For example, a wafer typically must leave a test station for fuses to be blown, and then return to the test station for verification. For DRAM memories, post burn-in module fallout may range from 25% or higher for early hardware in a new technology to less than 5% as the technology matures. Of these post burn-in module fallouts, approximately 80% are due to single cell bit failures. While single cell fails are recoverable with redundancy, laser fuse blow techniques cannot be applied to modules. Device yield therefore remains low despite the use of laser fuse blow techniques. Accordingly, a need exists for improved techniques for implementing redundancy within semiconductor integrated circuits.

SUMMARY OF THE INVENTION

As described in previously incorporated U.S. patent application Ser. No. 09/466,495, filed on even date herewith (titled "ANTIFUSES AND METHODS FOR FORMING THE SAME"), electronically programmable antifuses may be advantageously employed in place of laser blown fuses in redundant circuit applications because antifuses are blowable at the module level of a circuit design (while a wafer remains at a test station), as well as at the wafer level. However, to implement antifuse based redundancy schemes, it must be possible to sense the state of antifuses (e.g., whether or not an antifuse is blown so as to identify which array bits are bad and should be replaced), to blow antifuses (e.g., to actually implement redundant circuitry) and to generate the relatively high voltages required to blow antifuses (e.g., about 5 to 9 volts or higher). The present invention provides methods and apparatus for performing each of these functions.

In a first aspect of the invention, a method is provided for changing the state of one of a plurality of antifuses. The method includes selecting one of the bank of antifuses and applying a high voltage to change the state of the selected antifuse (e.g., to blow the selected antifuse).

In a second aspect of the invention, an apparatus is provided for changing the state of one of a plurality of antifuses each having a first and a second terminal. The apparatus includes a write/sense line and a plurality of selection devices. Each selection device is connected to the write/sense line, is adapted to connect to the second terminal of a different one of the plurality of antifuses and is adapted to select an antifuse by connecting the antifuse's second terminal to the write/sense line in response to a selection signal. The apparatus also includes a high voltage signal line adapted to connect to the first terminal of each of the plurality of antifuses and to apply a high voltage thereto that changes the state of any selected antifuse.

In a third aspect of the invention, an apparatus is provided for changing the state of an antifuse having a first and a second terminal. The apparatus includes a first voltage terminal and a selection device adapted to connect to the second terminal of the antifuse and connected to the first voltage terminal. The selection device is further adapted to select the antifuse by connecting the antifuse's second terminal to the first voltage terminal in response to a selection signal. The apparatus also includes a high voltage signal line adapted to connect to the first terminal of the antifuse and to apply a high voltage thereto that changes the state of the antifuse when the antifuse is selected.

In a fourth aspect of the invention, a method is provided for boosting a voltage (e.g., to a voltage sufficient to blow an antifuse). The method includes the steps of generating a first voltage within a first stage storage mechanism of a first stage voltage booster circuit, generating a second voltage equaling approximately twice the first voltage within a first and a second, second stage storage mechanism of a second stage voltage booster circuit, and generating approximately thrice the first voltage based on the second voltage of the second stage voltage booster circuit.

In a fifth aspect of the invention, a voltage booster circuit is provided. The voltage booster circuit includes a first stage voltage booster circuit having a first, first stage storage mechanism adapted to store a first voltage and a second stage voltage booster circuit connected to the first stage voltage booster circuit and having a first, second stage storage mechanism and a second, second stage storage mechanism each adapted to store approximately the first voltage. A first transfer mechanism is connected between the first and second voltage booster circuits and is adapted to transfer approximately twice the first voltage from the first stage voltage booster circuit to the second stage voltage booster circuit. A second transfer mechanism is connected to the second stage voltage booster circuit and is adapted to transfer approximately thrice the first voltage from the second stage voltage booster circuit.

The first, second and third aspects of the invention allow the state of an antifuse to be sensed and changed, while the fourth and fifth aspects of the invention allow the relatively high voltages required to blow an antifuse to be generated, preferably on-chip without requiring external connections.

Other objects, features and advantages of the present invention will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Figure 1A:
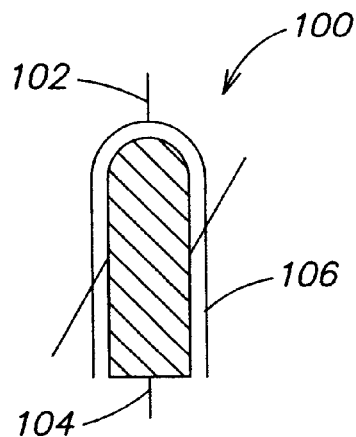
FIG. 1A is a schematic diagram of a deep trench (DT) antifuse.

FIG. 1A is a schematic diagram of a deep trench (DT) antifuse 100 (such as one of the deep trench antifuses described in previously incorporated U.S. patent application Ser. No. 09/466,495, filed Dec. 17, 1999 useful in describing the present invention. It will be understood that any other antifuse element may be similarly employed (e.g., gate oxide (GOX), shallow trench (STI), poly-to-metal, poly-to-poly, metal-to-metal, poly-to-diffusion, metal-to-diffusion, etc., antifuses).

The deep trench antifuse 100 comprises a buried plate (BP) terminal 102 and a node terminal 104 separated by a dielectric layer 106 (e.g., chemical vapor deposited silicon dioxide or silicon nitride). As described in previously incorporated U.S. patent application Ser. No. 09/466,495, filed Dec. 17, 1999, the electrical resistance of the antifuse 100 in its "unblown" state is on the order of a few Mohms or greater. However, the electrical resistance of the deep trench antifuse 100 can be modified by applying a high voltage (e.g., 5 to 8 volts or higher) across the buried plate capacitor terminal 102 and the node terminal 104 (e.g., by applying the high voltage to the buried plate terminal 102 while the node terminal 104 is grounded). The applied high voltage causes dielectric breakdown of the dielectric layer 106 and degrades the insulating properties thereof so as to create a relatively low resistance path (e.g., greater than 1,000 to 50,000 ohms) between the buried plate terminal 102 and the node terminal 104. This is known as "programming", "blowing" or "writing" the deep trench antifuse 100.

Figure 1B:
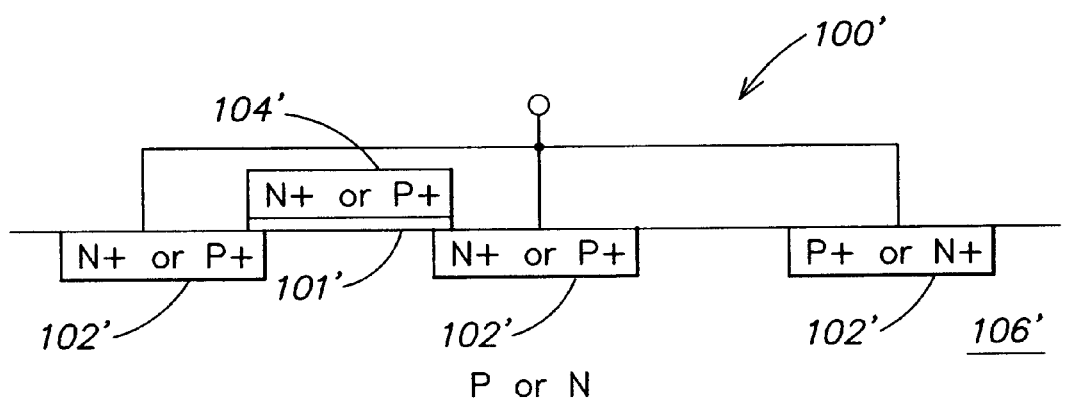
FIG. 1B is a schematic diagram of a gate oxide (GOX) antifuse fabricated from an NMOS or PMOS device.

FIG. 1B is a schematic diagram of a second antifuse element 100' comprising an NMOS or a PMOS device with a thin dielectric layer 101' between a gate 104' and diffusion regions 102' and a substrate 106'. As with the deep trench antifuse 100, and as described in previously incorporated U.S. patent application Ser. No. 09/466,495, filed Dec. 17, 1999, the resistance of the second antifuse element 100' is on the order of Mohms or greater when unprogrammed, and on the order of about 1,000 to 50,000 ohms after programming.

Figure 1C:
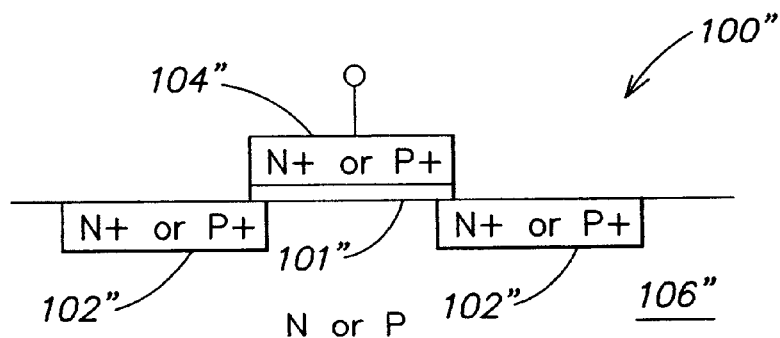
FIG. 1C is a schematic diagram of a GOX antifuse fabricated from an N+ (or P+) gate over an N and N+ (or P and P+) substrate.

FIG. 1C is a schematic diagram of a third antifuse element 100" comprising an N+ doped gate 104" formed on a dielectric layer 101", wherein the dielectric layer 101" is formed on N+ doped diffusion regions 102" and an N doped substrate 106"; or a P+ doped gate 104" formed on the dielectric layer 101", wherein the dielectric layer 101" is formed on P+ doped diffusion regions 102" and a P doped substrate 106". As in the case of the deep trench antifuse 100, and as described in previously incorporated U.S. patent application Ser. No. 09/466,495, filed Dec. 17, 1999, the resistance of the third antifuse element 100" is on the order of Mohms or greater when unprogrammed, and on the order of about 1,000 to 50,000 ohms after programming.

Figure 1D:
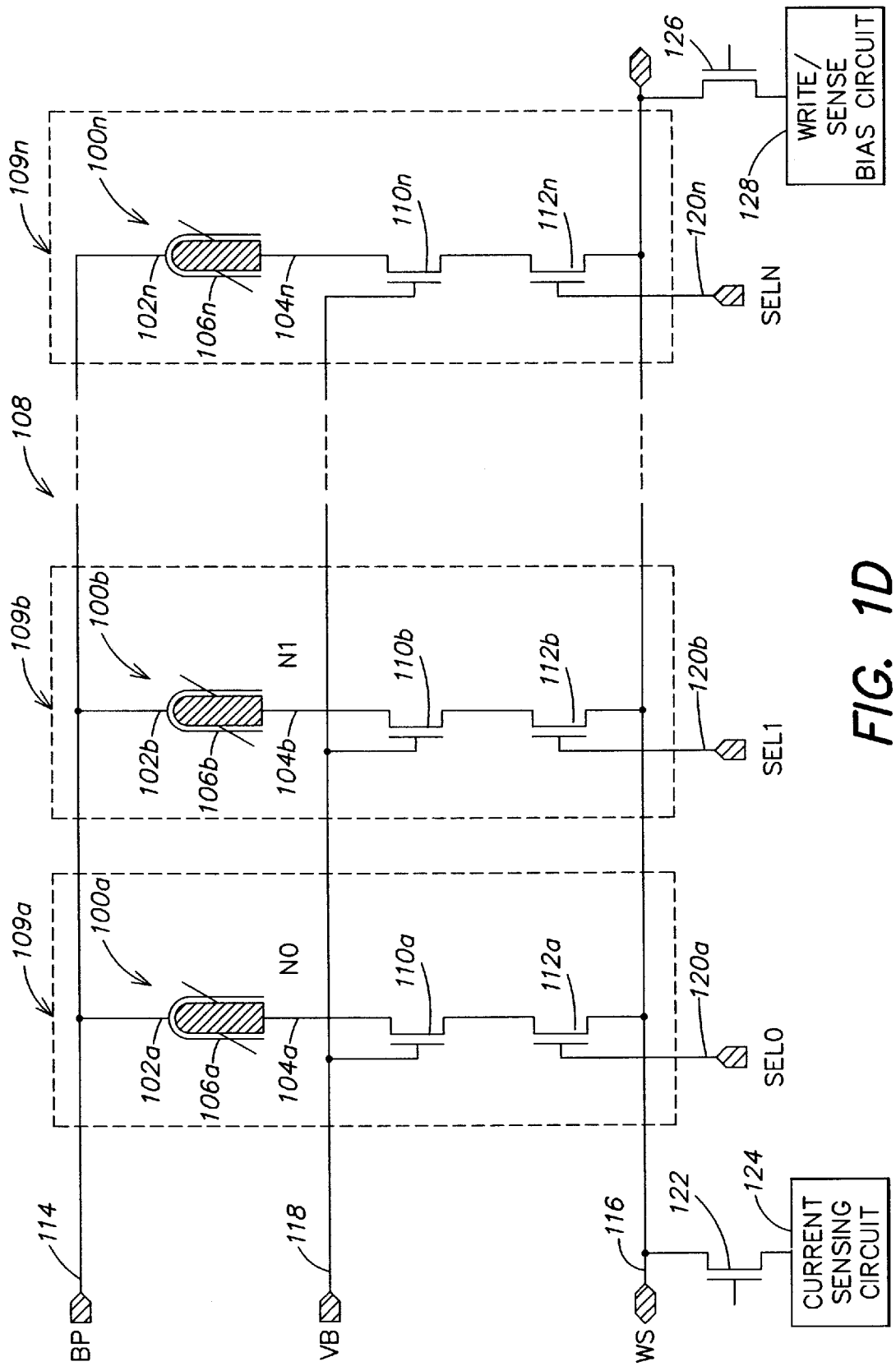
FIG. 1D is a schematic diagram of a first antifuse write and sense circuit configured in accordance with a first embodiment of the present invention that utilizes current sensing as a probe of antifuse condition.

FIG. 1D is a schematic diagram of a first antifuse write and sense circuit 108 configured in accordance with a first embodiment of the present invention that utilizes current sensing as a probe of antifuse condition. With reference to FIG. 1D, the first antifuse write and sense circuit 108 comprises a plurality of (or "bank" of) antifuse write/sense columns 109a–n. Each antifuse write/sense column 109a–n comprises an antifuse 100a–n, a bias n-channel metal-oxide-semiconductor field-effect transistor (NFET) 110a–n connected to the antifuse 100a–n, and an antifuse select NFET 112a–n connected to the bias NFET 110a–n as shown. Each bias NFET 110a–n may be replaced with a bipolar junction transistor (BJT) if desired.

Each antifuse 100a–n comprises a buried plate terminal 102a–n and a node terminal 104a–n separated by a dielectric layer 106a–n. The buried plate terminal 102a–n of each antifuse 100a–n is connected to a high voltage signal line (e.g., a buried plate (BP) signal line 114), and the node terminal 104a–n of each antifuse 100a–n is connected to a write/sense (WS) signal line 116 via a series connection of the bias NFET 110a–n and the antifuse select NFET 112a–n as shown. The gate of each bias NFET 110a–n is connected to a voltage bus (VB) signal line 118, and the gate of each antifuse select NFET 112a–n is connected to one of a plurality of independently addressable select lines 120a–n. The write/sense (WS) signal line 116 is connected via a sense enable NFET 122 to a current sensing circuit 124 and via a write enable NFET 126 to a write/sense (WS) bias circuit 128. The current sensing circuit 124 may comprise any known current sensing circuitry such as a resistive based current sensing circuit, the current differential amplifier of FIG. 27 of Baker et al., "CMOS Circuit Design, Layout and Simulation," IEEE Press, p.608 (1998), etc., and the write/sense bias circuit 128 may comprise the output of conventional logic circuitry.

Figure 2A:
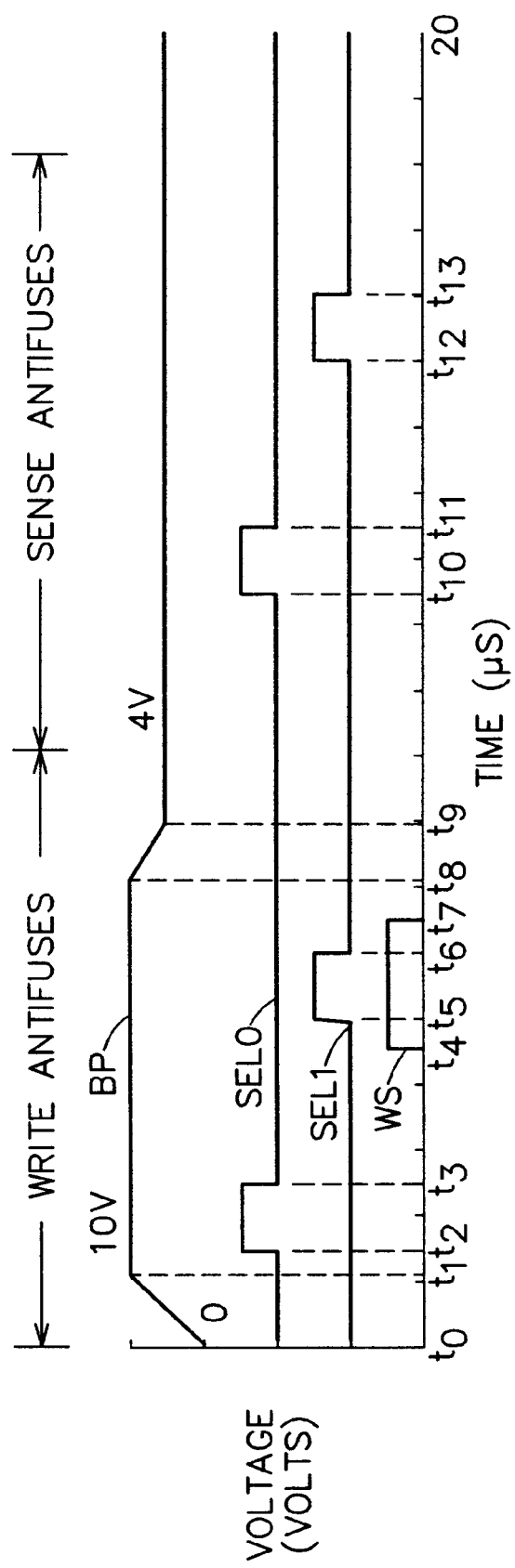
FIGS. 2A–C are timing diagrams illustrating the temporal behavior of the first antifuse write and sense circuit of FIG. 1B during both a write operation and a sense operation.
Figure 2B:
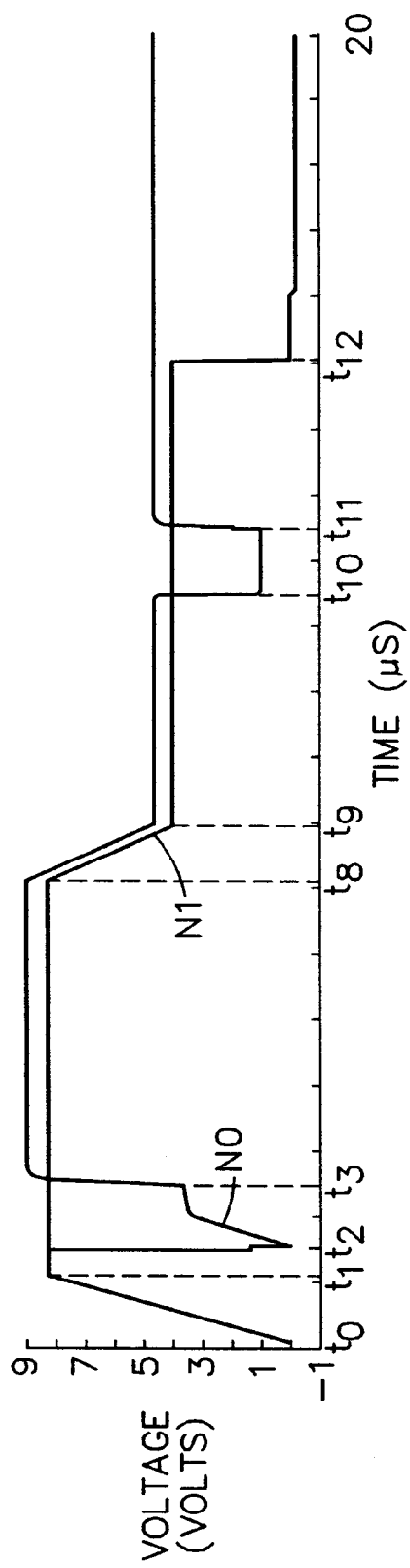
Figure 2C:
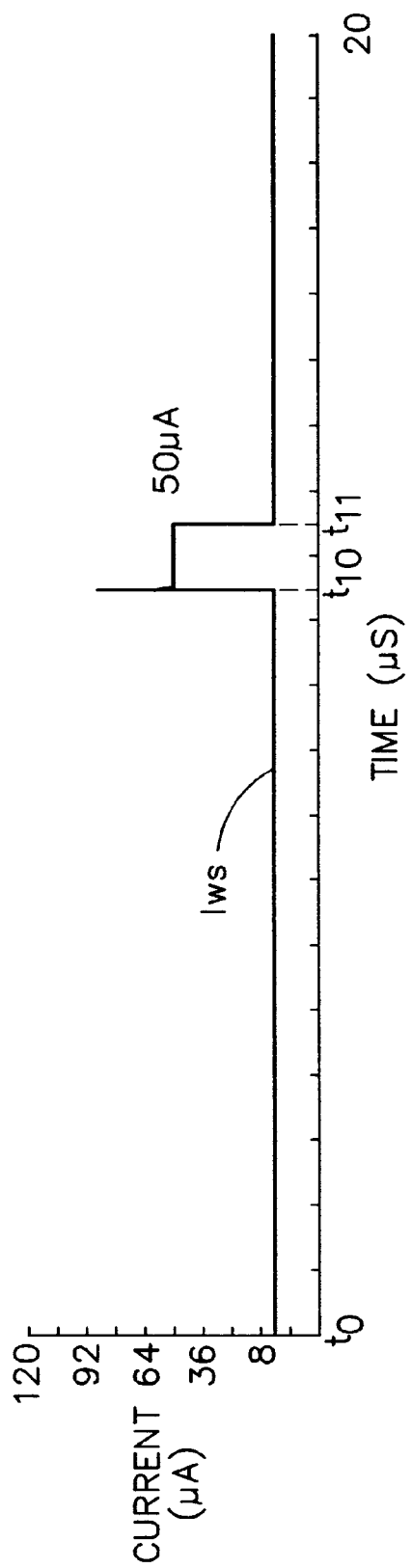

FIGS. 2A–C are timing diagrams illustrating the temporal behavior of the first antifuse write and sense circuit 108 of FIG. 1D during both a write operation (between times to and $t_8$) and a sense operation (between times $t_9$ and $t_{13}$). The vertical axis of FIGS. 2A and 2B represents voltage (in volts), the vertical axis of FIG. 2C represents current (in microamps) and the horizontal axis of FIGS. 2A–C represents time (in microseconds). Prior to time to the first antifuse write and sense circuit 108 is in its standby state with the buried plate (BP) signal line 114, the select lines 120a–n and the write/sense (WS) signal line 116 held at a low logic state (e.g. 0 volts). In this manner, each antifuse select NFET 112a–n is OFF and the buried plate (BP) signal line 114 are grounded so that the antifuses 100a–n is not biased.

With reference to FIGS. 2A–C, an antifuse write operation begins at time $t_0$. Between times $t_0$ and $t_1$, the voltage of the buried plate (BP) signal line 114 is ramped from 0 volts to 10 volts (and once at 10 volts is maintained at this voltage until time $t_8$) In response thereto, the voltages of the node terminals 104a–n are pulled high as shown in FIG. 2B by the node voltage N0 of node terminal 104a and by the node voltage N1 of node terminal 104b. Thereafter, between times $t_2$ and $t_3$, the first select line 120a (SEL0) is raised to a logic high (e.g., to between 2.5 and 5 volts).

At time $t_2$, the high logic signal applied to the first select line 120a (SEL0) turns ON the first antifuse select NFET 112a, connecting the write/sense (WS) signal line 116 to the node terminal 104a of the first antifuse 100a via the first bias NFET 110a. During this time, the write/sense (WS) signal line 116 is held at a low voltage via the write/sense bias circuit 128. Alternatively, the write/sense (WS) signal line 116 may be pulsed such that a burst of pulses is applied thereto (instead of a static voltage). As a result thereof, the high voltage (e.g., 10 volts) applied to the buried plate (BP) signal line 114 is presented across the first antifuse 100a causing it to program (e.g., by breaking down the dielectric layer 106a) as shown by the drop in the voltage (N0) of node terminal 104a (FIG. 2B). At time $t_3$, the voltage of the first select line 120a (SEL0) is decreased to a low voltage, turning OFF the first antifuse select NFET 112a so as to disconnect the high voltage applied across the first antifuse 100a. In response thereto, the voltage (N0) of the node terminal 104a returns high (FIG. 2B).

At time $t_4$, the write/sense (WS) signal line 116 is raised to a high voltage state (e.g., +5 volts), disabling antifuse programming (e.g., by limiting the voltage that may be applied across an antifuse as described below). For example, between times $t_5$, and $t_6$, the second select line 120b (SEL1) is raised to a high logic level (e.g., to between 2.5 volts and 5 volts). At time $t_5$, the high logic level applied to the second select line 120b (SEL1) turns ON the second antifuse select NFET 112b, connecting the write/sense (WS) signal line 116 to the node terminal 104b of the second antifuse 100b via the second bias NFET 110b. Despite the 10 volts present on the buried plate (BP) signal line 114, the antifuse 100b is not blown because (with the write/sense (WS) signal line 116 at +5 volts) the voltage applied across the antifuse dielectric layer 106b of the second antifuse 100b is limited to about 5 volts.

After time $t_6$, the second select line 120b (SEL1) is returned to a low voltage, turning OFF the second antifuse select NFET 112b so as to isolate the second antifuse 100b from the write/sense (WS) signal line 116. At time $t_7$, the write/sense (WS) signal line 116 is returned to a low voltage (e.g., via the write/sense bias circuit 128). Between times $t_8$ and $t_9$ the voltage of the buried plate (BP) signal line 114 is ramped down from a high voltage to a "sense" voltage (e.g., about 4 volts), and subsequent to time $t_9$ (e.g., during the sense operation), the voltage of the buried plate (BP) signal line 114 is maintained at the sense voltage. Note that while only the first antifuse 10a is shown as being blown at time $t_2$, any of the other antifuses 100a–n also may be simultaneously blown by applying a high logic level to the select lines of the antifuses to be blown. The first antifuse write and sense circuit 108 thus allows parallel antifuse blowing.

During the sense operation (between times $t_9$ and $t_{13}$), the condition (e.g., blown or unblown) of the antifuse 100a and the condition of the antifuse 100b within the first antifuse write and sense circuit 108 are interrogated by individually activating the antifuse select NFETs 112a, 112b. As illustrated in FIG. 2A, between times $t_{10}$ and $t_{11}$, the condition of the first antifuse 100a is sensed by turning ON the first antifuse select NFET 112a (by raising the voltage of first select line 120a (SEL0) to a high state (e.g. +5 volts)) so as to connect the antifuse 100a to the write/sense (WS) signal line 116 via the first bias NFET 110a, and by monitoring the level of current flowing through the first antifuse write/sense column 109a in response thereto. If the first antifuse 100a is unblown, little current flows between the buried plate (BP) signal line 114 and the write/sense (WS) signal line 116 because of the high resistance (e.g., several Mohms or more) associated with the unblown antifuse. However, if the first antifuse 100a is blown, a large current flows between the buried plate (BP) signal line 114 and the write/sense (WS) signal line 116 because of the low resistance (e.g., a few kohms or less) associated with the blown antifuse. The flow of current between the buried plate (BP) signal line 114 and the write/sense (WS) signal line 116 is monitored by the current sensing circuit 124. Accordingly, because the first antifuse 100a is blown, between times $t_{10}$ and $t_{11}$, a large current ($I_{WS}$) flows on the write/sense (WS) signal line 116 during current sensing of the first antifuse 100a (FIG. 2C). Between times $t_{12}$ and $t_{13}$, the condition of the second antifuse 100b is sensed in a manner similar to the condition of the first antifuse 100a. However, because the second antifuse 100b is not blown, no significant current change is observed between times $t_{12}$ and $t_{13}$.

Figure 3:
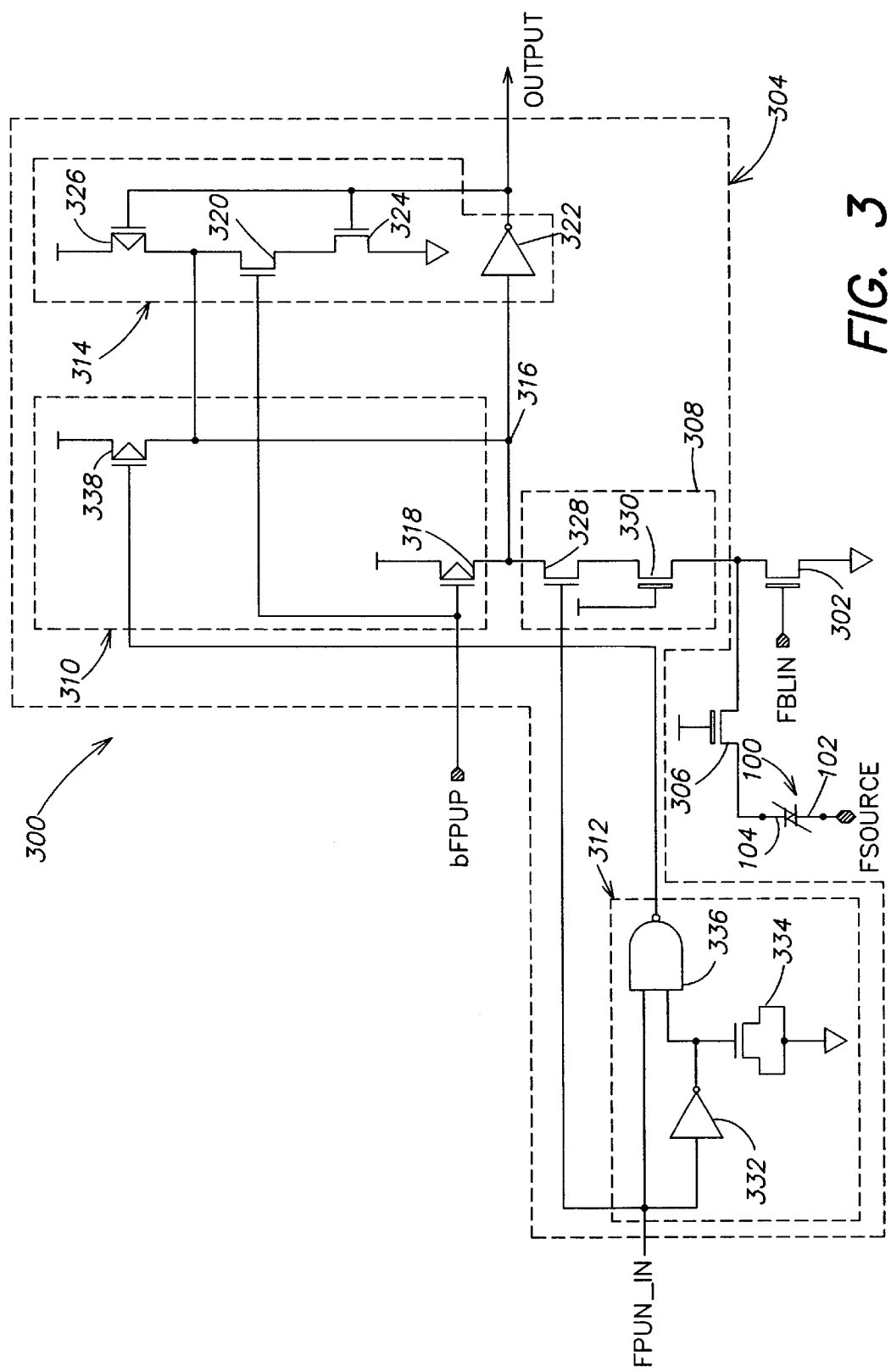
FIG. 3 is a schematic diagram of a second antifuse write and sense circuit configured in accordance with a second embodiment of the present invention that utilizes voltage sensing to probe the condition of an antifuse.

FIG. 3 is a schematic diagram of a second antifuse write and sense circuit 300 configured in accordance with a second embodiment of the present invention that utilizes voltage sensing to probe the condition of an antifuse. The second antifuse write and sense circuit 300 comprises an antifuse 100 having a node terminal 104 connected to a fuse-blow enable NFET 302 and to a voltage sense circuit 304 via a bias NFET 306, and a buried plate (BP) terminal 102 connected to a high voltage signal line (e.g., an FSOURCE terminal). The gate of the bias NFET 306 is tied to a circuit power supply rail, maintaining the bias NFET 306 in an ON state. The gate of the fuse-blow enable NFET 302 is connected to a FBLIN terminal.

The voltage sense circuit 304 comprises a sense select circuit 308 connected to the bias NFET 306, to the fuse-blow enable NFET 302 and to a FPUN_IN terminal; a pre-charge circuit 310 connected to the sense select circuit 308 and to a bFPUP terminal; a one shot pulse generator 312 connected to the pre-charge circuit 310 and to the FPUN_IN terminal, and a latch circuit 314 connected to the pre-charge circuit 310 and the sense select circuit 308 via a sense node 316 and to the bFPUP terminal.

In operation, to program or "blow" the antifuse 100 employing the second antifuse write and sense circuit 300, a high voltage (e.g., 8 volts or greater) is applied to the FSOURCE terminal, and the fuse-blow enable NFET 302 is turned ON by raising the FBLIN terminal to a high logic state. Because the bias NFET 306 is always ON, the high voltage applied to the FSOURCE terminal is applied across the antifuse 100, causing the antifuse 100 to program. Note that the voltage sense circuit 304 is not employed during a write operation.

To determine the condition of the antifuse 100 (e.g., whether the antifuse 100 is blown or unblown), the sense node 316 first must be pre-charged. When power is first applied to the voltage sense circuit 304, the sense node 316 is pre-charged by ramping the BFPUP terminal from a low logic state to a high logic state at a rate slower than the rate at which the circuit power supply rail turns ON. While the BFPUP terminal is low and the circuit power supply rail is high, an initialization pre-charge PFET 318 within the pre-charge circuit 310 is ON and a first latch NFET 320 within the latch circuit 314 is OFF. With the initialization pre-charge PFET 318 ON, the sense node 316 is connected to the circuit power supply rail and is pre-charged high (e.g., to the voltage of the circuit power supply rail). After the BFPUP terminal ramps to a high voltage, the initialization pre-charge PFET 318 turns OFF and the first latch NFET 320 turns ON. In response to the sense node 316 being at a high voltage, a latch inverter 322 within the latch circuit 314 pre-sets the gates of a second latch NFET 324 and a latch PFET 326 with a signal that is the logical inverse of the voltage of sense node 316. Accordingly, with the sense node 316 pre-charged high, a low voltage is applied to the gates of the second latch NFET 324 and the latch PFET 326, the second latch NFET 324 is OFF, the latch PFET 326 is ON (e.g., connecting the sense node 316 to the circuit power supply rail) and the pre-charge state of the sense node 316 is maintained. In general, the latch inverter 322 turns the second latch NFET 324 and the latch PFET 326 ON (or OFF) in a mutually exclusive manner (e.g., if the second latch NFET 324 is ON then the latch PFET 326 is OFF and vice versa). As a result thereof, the state of the sense node 316 is maintained in either a charged state or a discharged state (described below) by being connected to either the circuit power supply rail when the latch PFET 326 is ON, or to ground through the first latch NFET 320 when the second latch NFET 324 is ON.

Once the sense node 316 is pre-charged, the antifuse condition sensing operation is triggered by applying a high logic level signal pulse to the FPUN_IN terminal. With the FPUN_IN terminal high, a read-enable NFET 328 within the sense select circuit 308 is turned ON, connecting the antifuse 100 to the sense node 316 via a pass NFET 330 within the sense select circuit 308 and via the bias NFET 306. The rising edge transition of the voltage pulse applied to the FPUN_IN terminal also triggers the one-shot pulse generator 312 to generate a low logic level pulse. Specifically, prior to applying a high logic level signal pulse to the FPUN_IN terminal, a low logic level is applied to the FPUN_IN terminal and within the one shot pulse generator 312, an inverter 332 charges a capacitor 334 to a high logic level. The low level applied to the FPUN_IN terminal and the high logic level of the charged capacitor 334 are input to a NAND gate 336 which, in response thereto, outputs a high logic level to a pre-charge PFET 338 of the pre-charge circuit 310; and the pre-charge PFET 338 is OFF. Thereafter, in response to the high logic level signal pulse applied to the FPUN_IN terminal, the output of the NAND gate 336 drops to a low logic level as a high logic level is initially applied to both inputs of the NAND gate 336 (until the capacitor 334 discharges in response to the high logic level signal pulse). The width of the low logic level pulse output from the NAND gate 336 of the one-shot pulse generator 312 is determined by the logic delays of the inverter 332 and the NAND gate 336, and by the capacitance of capacitor 334 as is known in the art.

The low logic level pulse output from the one-shot pulse generator 312 turns ON the pre-charge PFET 338 of the pre-charge circuit 310, providing a second low resistance path (in addition to the path created by latch PFET 326) between the sense node 316 and the circuit power supply rail during the initial period of a sense operation. This additional path is created only at the onset of sensing and ensures that the sense node 316 is fully pre-charged despite parasitic capacitance paths to ground (e.g., parasitic capacitance paths to ground associated with the voltage sense circuit 304, the fuse-blow enable NFET 302 and the antifuse 100 (typically having a capacitance of about 35–75 femto-Farads)).

When the output of the one-shot pulse generator 312 rises to a high logic level (e.g., when the capacitor 334 sufficiently discharges), the pre-charge PFET 338 turns OFF, leaving the sense node 316 connected to the circuit power supply rail only through the latch PFET 326. If the antifuse 100 is unblown, no discharge path to ground (other than parasitic paths) exists to discharge the sense node 316. Accordingly, the sense node 316 is maintained in it's pre-charged, high voltage state. The output of the latch inverter 322 (and hence the output of the second antifuse write and sense circuit 300) remains low, indicating that the antifuse 100 is unblown. However, if the antifuse 100 is blown, the sense node 316 discharges through the low resistance path to ground generated by the blown antifuse 100. In response thereto, the output of the latch inverter 322 (and the output of the second antifuse write and sense circuit 300) is driven high, indicating that the antifuse 100 is blown. The high logic level output by the latch inverter 322 turns ON the second latch NFET 324 of the latch circuit 314 and maintains the sense node 316 at ground potential. The output of the second antifuse write and sense circuit 300 thus latches to a high logic level only if the antifuse 100 is blown.

Note that because of the properties of antifuses (e.g., programmed resistances of about 1 to 20 kohms, unprogrammed resistances of up to a few gigaohms, capacitances of about 35–70 femto-Farads, etc.), the minimum antifuse resistance required for the voltage sense circuit 304 to designate an antifuse as unprogrammed or the maximum antifuse resistance allowed for the voltage sense circuit 304 to designate an antifuse as programmed (i.e., the latch trip point resistance of the voltage sense circuit 304) preferably is set to about 50 kohms. The latch trip point resistance of the voltage sense circuit 304 preferably is set to about 50 kohms by PFET 326 (e.g., by the channel width to channel length ratio of the PFET 326). Absent the pre-charge PFET 338, such a large latch trip point resistance (e.g., 50 kohms) may cause the voltage sense circuit 304 to erroneously latch due to charge sharing between the sense node 316 and the capacitance of an unprogrammed antifuse.

Figure 4A:
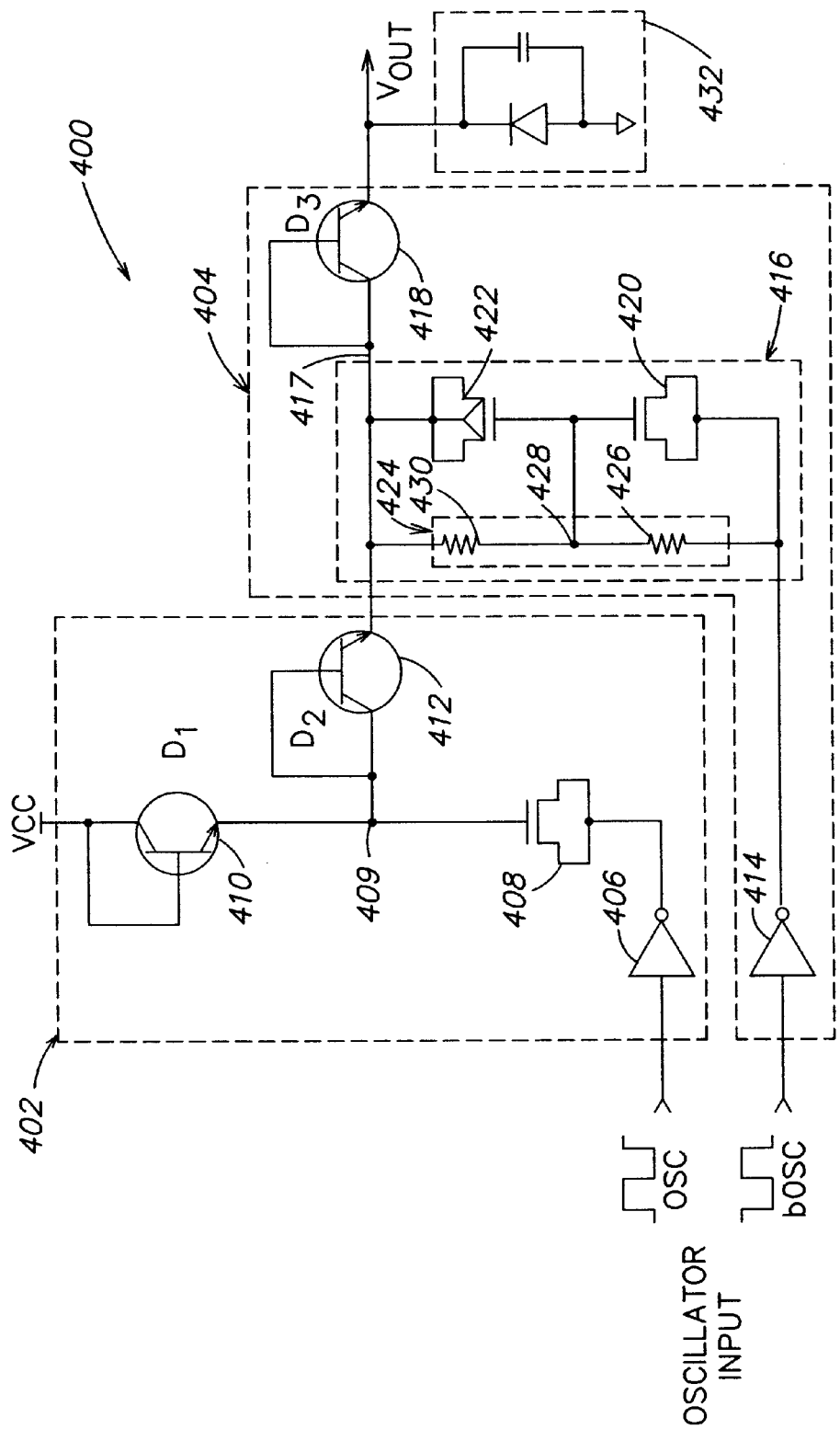
FIG. 4A is a schematic diagram of a first voltage booster circuit for generating the high voltage necessary for blowing antifuses.

FIG. 4A is a schematic diagram of a first voltage booster circuit 400 for generating the high voltage necessary for blowing antifuses. As described below, the first voltage booster circuit 400 generates a high voltage signal ($V_{OUT}$) from a relatively low voltage signal (e.g., preferably an on-chip signal such as a power supply rail voltage $V_{CC}$ so that an external high voltage signal is not required). The high voltage generated by the first voltage booster circuit 400 preferably is approximately three times the power supply rail voltage $V_{CC}$ that powers the voltage booster circuit (e.g., within a few diode drops of three times the power supply rail voltage).

The first voltage booster circuit 400 comprises a first stage voltage booster circuit 402 connected to a second stage voltage booster circuit 404. The input of the first stage voltage booster circuit 402 and the input of the second stage voltage booster circuit 404 are driven by complimentary oscillator signals OSC and bOSC, respectively. The oscillator signals OSC and bOSC may be generated by any known oscillator circuitry and preferably have magnitudes equal to the power supply rail voltage ($V_{CC}$) and a frequency of about 0.5 GHz to 1 GHz and beyond.

The OSC signal is input to the first stage voltage booster circuit 402 and feeds a first stage inverter 406 having an output connected to the source-drain terminals of a first stage capacitor 408 (e.g., an NFET capacitor). The gate terminal of the first stage capacitor 408 is connected to a first stage node 409, to a first stage pre-charge BJT 410 and to a first stage transmission BJT 412. The first stage pre-charge BJT 410 and the first stage transmission BJT 412 are both configured as diodes (e.g., the base and collector terminals of each transistor are tied together).

The bOSC signal is input to the second stage voltage booster circuit 404 and feeds a second stage inverter 414 having an output connected to a first terminal of a second stage capacitor bank 416. The second terminal of the second stage capacitor bank 416 is connected to a second stage node 417, to the output of the first stage voltage booster circuit 402 (e.g., to the emitter of the first stage transmission BJT 412, which 'pre-charges' the second stage node 417), and to a second stage transmission BJT 418. The second stage transmission BJT 418 also is configured as a diode as shown.

In operation, when the OSC signal is high, the output of the first stage inverter 406 and the source-drain terminal of the first stage capacitor 408 are held low (e.g., at 0 volts). In response thereto, the first stage pre-charge BJT 410 precharges the first stage node 409 to $V_{CC}$ minus the forward voltage drop of the diode formed from the first stage pre-charge BJT 410 ($V_{410}$), typically about 0.7 to 0.8 volts for a bipolar diode, and 0.2 to 0.4 volts for a Schottky diode. When the OSC signal switches to a low logic level, the output of the first stage inverter 406 and the source-drain terminal of the first stage capacitor 408 switch to a high logic level (e.g., $V_{CC}$). Accordingly, the voltage of the first stage node 409 is raised from $V_{CC}-V_{410}$ to $2V_{CC}-V_{410}$. In response to the voltage at the first stage node 409, the first stage transmission BJT 412 turns ON, and the voltage at the first stage node 409 (e.g., the charge stored by the first stage capacitor 408) is transferred out of the 10 first stage voltage booster circuit 402 to the second stage voltage booster circuit 404, with an additional voltage drop due to the forward voltage of the diode formed from the first stage transmission BJT 412 ($V_{412}$). The final voltage output by the first stage voltage booster circuit 402 (and input by the second stage voltage booster circuit 404) is $2V_{CC}-V_{410}-V_{412}$ (about $2V_{CC}-0.8$ volts)

While the OSC signal is low, the bOSC signal is high so that the output of the second stage inverter 414 and the source-drain terminal of a first capacitor 420 of the second stage capacitor bank 416 are low. Accordingly, the output of the first stage voltage booster circuit 402 pre-charges the second stage node 417 to $2V_{CC}-V_{410}-V_{412}$ by charging the second stage capacitor bank 416 thereto (e.g., by charging the first capacitor 420 (e.g., an NFET) and a second capacitor 422 (e.g., a PFET) of the second stage capacitor bank 416 as described below).

The resultant voltage applied across the second stage capacitor bank 416 (e.g., $2V_{CC}-V_{410}-V_{412}$) when the first stage transmission BJT 412 conducts is sufficiently high to breakdown the gate oxide of the first or the second capacitors 420, 422 if much more than about half of the resultant voltage were to be applied across either capacitor. To avoid gate oxide breakdown, the second stage capacitor bank 416 includes a voltage divider network 424 that ensures that only one half of the voltage at the second stage node 417 is applied across the first capacitor 420 and the second capacitor 422. The voltage divider network 424 comprises a first resistor 426 connected between the source-drain terminal of the first capacitor 420 and the gate of the first capacitor 420 (e.g., at a voltage divider node 428), and a second resistor 430 connected between the voltage divider node 428 and second stage node 417. The first resistor 426 and the second resistor 430 preferably have equal resistance values so that the voltage applied to the second stage node 417 is divided equally between the first and second capacitors 420, 422 (which preferably have the same capacitance values). In this manner, the voltage divider network 424 evenly distributes voltage applied to the second stage node 417 across the first and second capacitors 420, 422, and no voltage having sufficient magnitude to breakdown a gate oxide is ever applied across either capacitor. The first and second capacitors 420, 422 therefore may be fabricated using a standard CMOS process.

When the bOSC signal falls low, the second stage inverter 414 applies a high logic level (e.g., VCC) to the second stage capacitor bank 416, which in turn raises the voltage of the second stage node 417 to $3V_{CC}-V_{410}-V_{412}$. In response to this high voltage, the second stage transmission BJT 418 turns ON, and the voltage at the second stage node 417 (e.g., the charge stored by the first and second capacitors 420, 422) is transferred from the second stage voltage booster circuit 404 (e.g., to an antifuse represented generally by parasitic load 432), minus an additional voltage drop due to the forward voltage drop of the second stage transmission BJT 418 ($V_{418}$). The final voltage (VOUT) output by the second stage voltage booster circuit 404 (and thus by the first voltage booster circuit 400) is $3V_{CC}-V_{410}-V_{412}-V_{418}$ (about $3V_{CC}-1.2$ volts or about 13.8 volts for a 5 volt power supply rail), a voltage sufficient for blowing antifuses with the first antifuse write and sense circuit 108 of FIG. 1D and with the second antifuse write and sense circuit 300 of FIG. 3.

Figure 4B:
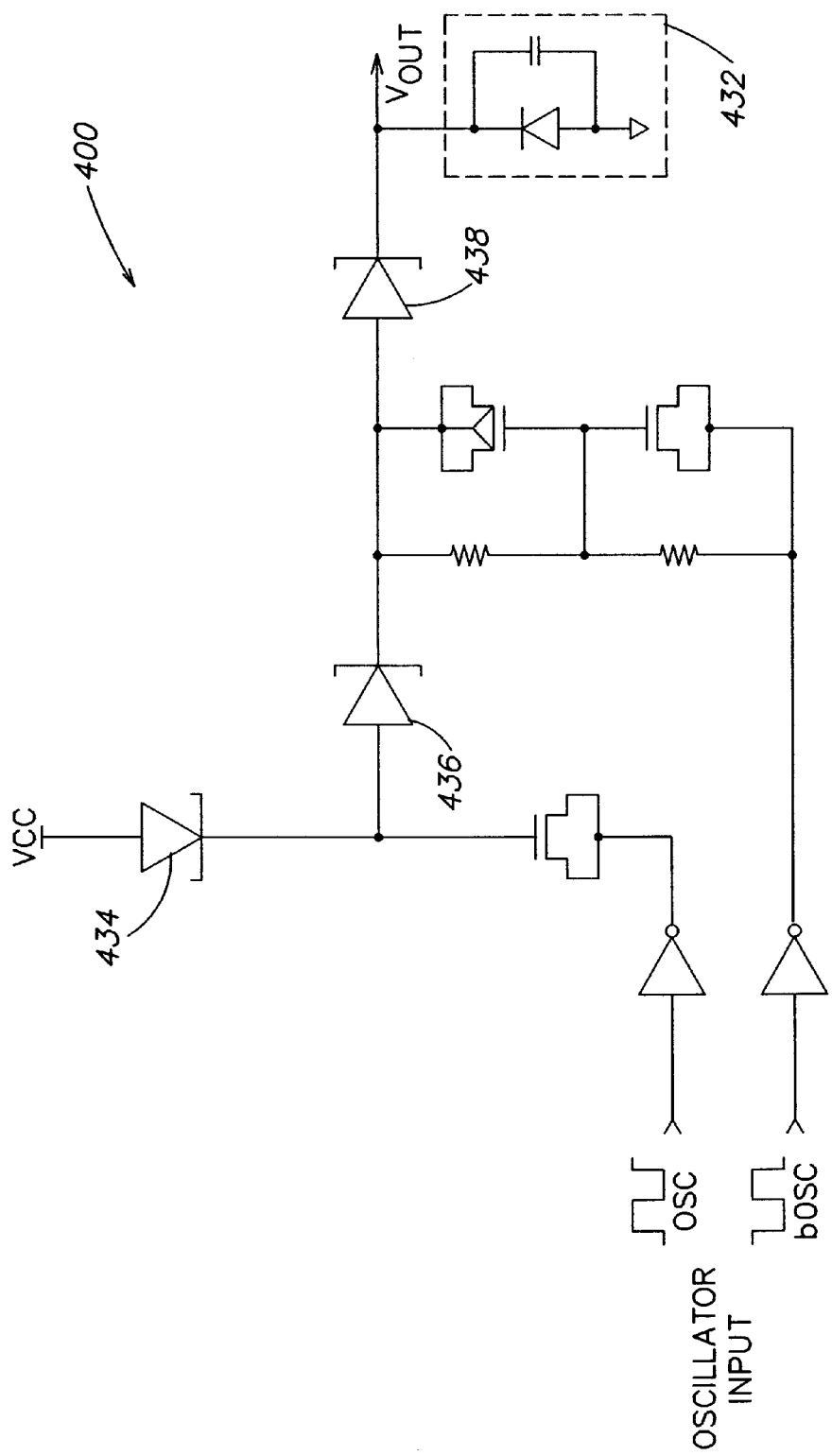
FIG. 4B is a schematic diagram of the first voltage booster circuit of FIG. 4A wherein Schottky diodes are employed.

An alternative embodiment of the first voltage booster circuit 400 is to replace each of the first stage pre-charge BJT 410, the first stage transmission BJT 412 and the second stage transmission BJT 418 with Schottky diodes 434, 436 and 438, respectively, as shown in FIG. 4B. Because Schottky diodes have lower forward bias voltage drops and shorter recovery times, both the voltage output by and the operating frequency of the first voltage booster circuit 400 will be increased by employing the Schottky diodes 434, 436 and 438.

Figure 5:
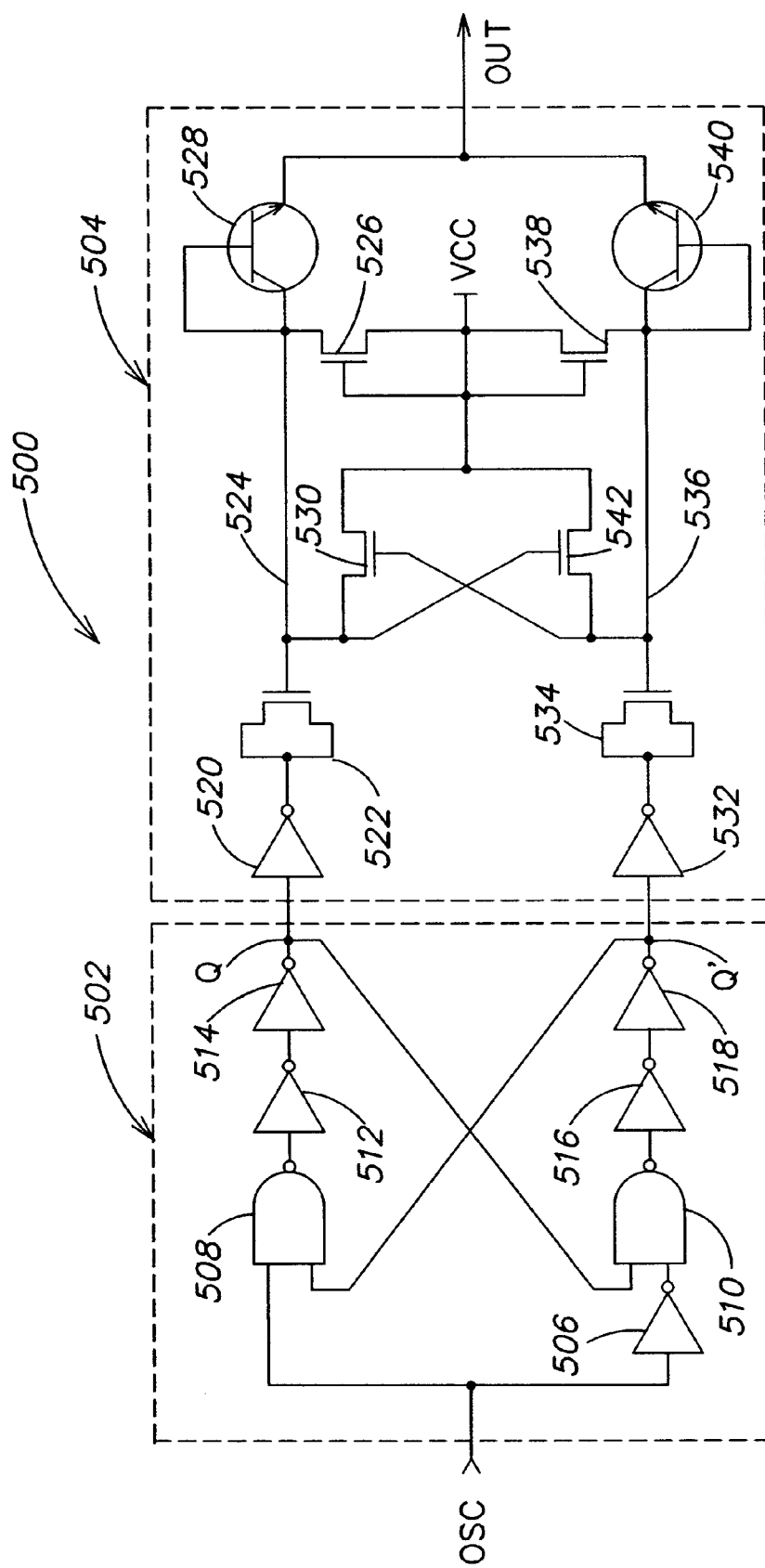
FIG. 5 is a schematic diagram of a voltage doubler circuit.

FIG. 5 is a schematic diagram of a voltage doubler circuit 500. The voltage doubler circuit 500 comprises a toggle flip-flop 502 having an input for receiving an oscillator (OSC) signal, and a full wave voltage boosting (FWVB) circuit 504 connected to a true output (Q) and complementary output (Q') of the flip-flop 502.

The toggle flip-flop 502 comprises a flip-flop input inverter 506 and a first flip-flop NAND gate 508 each having a first input adapted to receive the OSC signal. The output of the first flip-flop NAND gate 508 is connected to a first input of a second flip-flop NAND gate 510 via a first delay inverter 512 and a second delay inverter 514. A second input of the second flip-flop NAND gate 510 is connected to the output of the flip-flop input inverter 506, and the output of the second flip-flop NAND gate 510 is connected to a second input of the first flip-flop NAND gate 508 via a third delay inverter 516 and a fourth delay inverter 518. As is known in the art, the inverter delayed cross-linked NAND gate configuration of the first flip-flop NAND gate 508, the second flip-flop NAND gate 510, and the first, second, third and fourth delay inverters 512, 514, 516 and 518 forms a bi-stable flip-flop with true and complementary outputs (Q), (Q') that "toggle" between high and low logic levels on each cycle of the OSC signal (e.g., when the Q output is high, the Q' output is low, and vice versa).

The FWVB circuit 504 comprises a first boosting inverter 520 having an input connected to the Q output of the toggle flip-flop 502, and an output connected to the source-drain terminal of a first capacitor 522 (e.g., an NFET capacitor). The gate of the first capacitor 522 is connected to a first node 524, to a first initialization NFET 526, to a first transmission BJT 528 (e.g., a diode configured BJT) and to a first pre-charge NFET 530. The FWVB circuit 504 further comprises a second boosting inverter 532 having an input connected to the Q' output of the toggle flip-flop 502, and an output connected to the source-drain terminal of a second capacitor 534. The gate terminal of the second capacitor 534 is connected to a second node 536, to a second initialization NFET 538, to a second transmission BJT 540 (e.g., a diode configured BJT) and to a second pre-charge NFET 542.

In operation, at power-up, the first node 524 and the second node 536 are pre-charged to a voltage of $V_{CC}-V_{TH}$, via the first and second initialization NFETs 526, 538 (where $V_{TH}$ is the threshold voltage of the first and second initialization NFETs 526, 538, which is preferably and is assumed herein to be the same for NFETs 526 and 538). The threshold voltage for the first and second initializations NFETs 526, 538 preferably is about 0.6 volts.

Thereafter, when the Q output is high (and Q' is low), the output of the first boosting inverter 520 and the source-drain terminal of the first capacitor 522 are low and, because the voltage applied across the first transmission BJT 528 is insufficient to turn ON the BJT 528, the first node 524 maintains its pre-charge voltage of $V_{CC}-V_{TH}$. However, with the Q' output low, the output of the second boosting inverter 532 and the source-drain terminal of the second capacitor 534 are high so that the second node 536 is raised to a voltage of $2V_{CC}-V_{TH}$. Because this voltage is sufficient to turn ON the second transmission BJT 540, the voltage at the second node 536 (e.g., the charge stored by the second capacitor 534) is output via the second transmission BJT 540, with an additional voltage drop due to the forward voltage drop of the diode formed from the second transmission BJT 540 ($V_{540}$). The voltage output by the voltage doubler circuit 500 when the Q output is high and the Q' output is low therefore is $2V_{CC}-V_{TH}-V_{540}$.

When the Q output is low (and the Q' output is high), the output of the first boosting inverter 520 and the source-drain terminal of the first capacitor 522 are high so that the first node 524 is raised to a voltage of $2V_{CC}-V_{TH}$. Because this voltage is sufficient to turn ON the first transmission BJT 528, the voltage at the first node 524 (e.g., the charge stored by the first capacitor 522) is output via the first transmission BJT 528, with an additional voltage drop due to the forward voltage drop of the diode formed from the first transmission BJT 528 ($V_{528}$) With the Q' output high, the output of the second boosting inverter 532 and the source-drain terminal of the second capacitor 534 are low so that the voltage applied across the second transmission BJT 540 is insufficient to turn ON the second transmission BJT 540. The voltage output by the voltage doubler circuit 500 when the Q output is low and the Q' output is high therefore is $2V_{CC}-V_{TH}-V_{528}$. Note that while the voltage of the first node 524 is being output (when the Q output is low), the second pre-charge NFET 542 is ON and pre-charges the second node 536 (which was discharged during the previous cycle when the Q output was low) to a voltage of $V_{CC}-V_{TH}$. Similarly, while the voltage of the second node 536 is being output (when the Q output is high), the first pre-charge NFET 530 is ON and pre-charges the first node 524 (which was discharged during the previous cycle when the Q output was low) to a voltage of $V_{CC}-V_{TH}$. Hereinafter the voltages $V_{528}$ and $V_{540}$ are assumed equal and are referred to as $V_{CE}$ so that the voltage output by the voltage doubler circuit 500 as $2V_{CC}-V_{TH}-V_{CE}$.

Figure 6A:
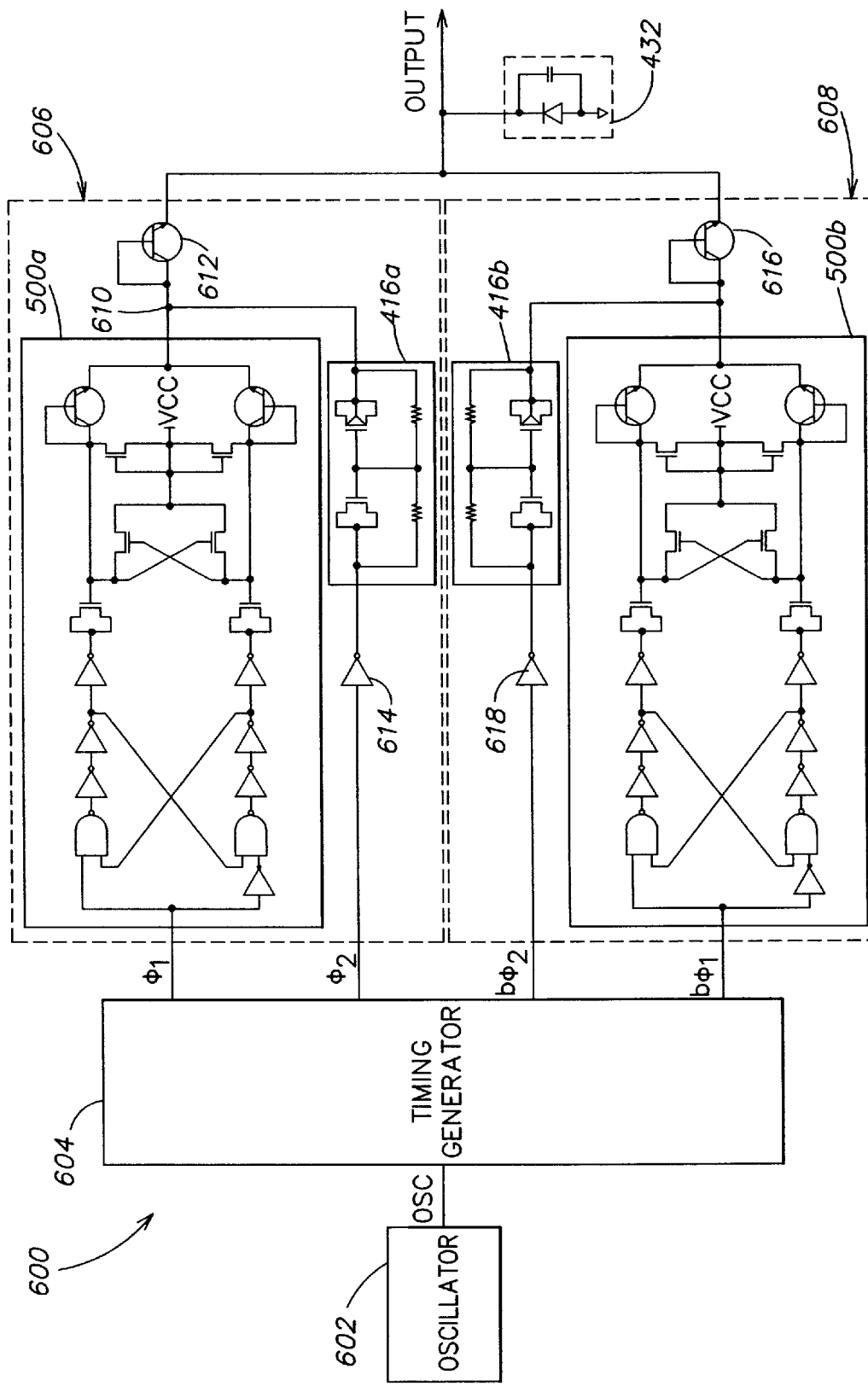
FIG. 6A is a schematic diagram of a two stage voltage booster circuit utilizing the voltage doubler circuit of FIG. 5.
Figure 6B:
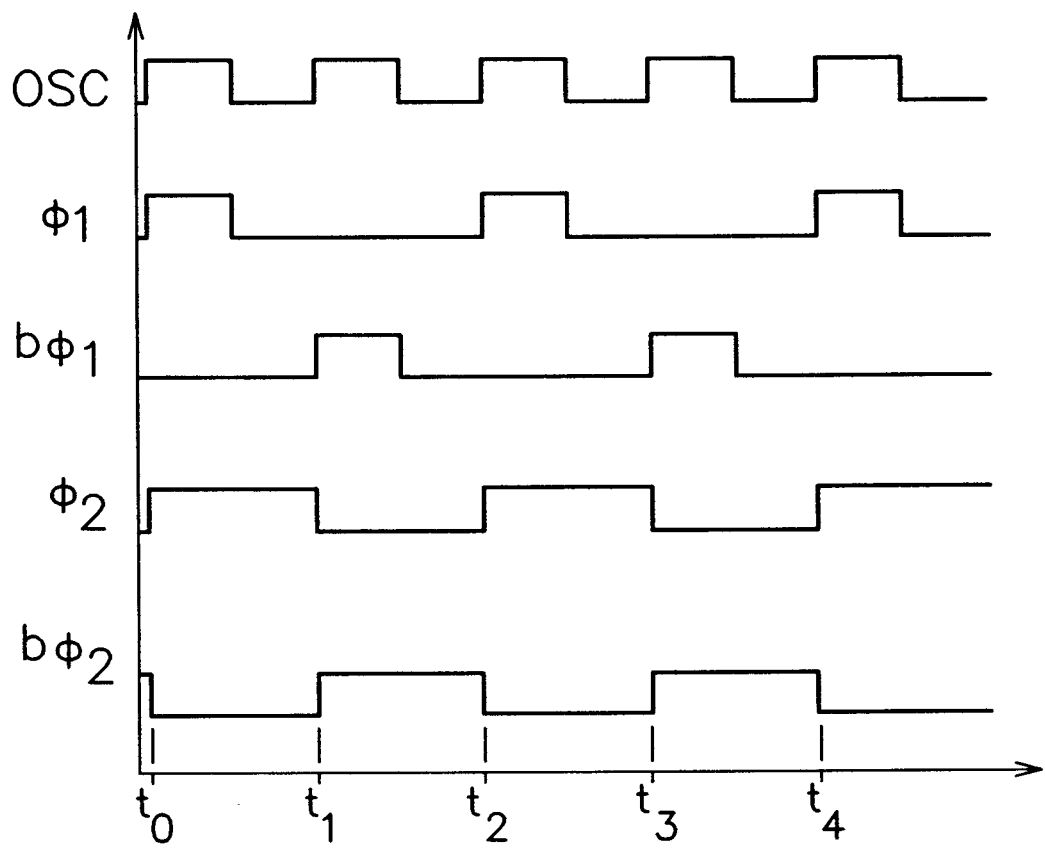
FIG. 6B is a timing diagram of the clock signals generated by the timing generator of the two stage voltage booster circuit of FIG. 6A.

In order to generate a voltage sufficient to blow an antifuse, the voltage doubler circuit 500 is employed in a two stage booster configuration. FIG. 6A is a schematic diagram of a preferred embodiment of a two stage voltage booster circuit 600 utilizing the voltage doubler circuit 500 of FIG. 5. With reference to FIG. 6A, the voltage booster circuit 600 comprises an oscillator 602 connected to a timing generator 604 (e.g., such as an inverter chain, a shift register chain, etc.), and a first voltage booster circuit 606 and a second voltage booster circuit 608 connected to the timing generator 604. The oscillator 602 drives the timing generator 604 with an oscillator (OSC) signal, preferably having a frequency of about 0.5 GHz to 1 GHz or higher, and, in response thereto, the timing generator 604 generates four clock signals: $\phi_1$, $\phi_2$, $b\phi_1$ and $b\phi_2$ (where $b\phi_1$ and $b\phi_2$ are the complements of $\phi_1$ and $\phi_2$, respectively). The relationship between OSC, $\phi_1$, $\phi_2$, $b\phi_1$, and $b\phi_2$ is shown in FIG. 6B. The $\phi_1$ and $\phi_2$ clock signals are applied to the first voltage booster circuit 606 and the $b\phi_1$ and $b\phi_2$ clock signals are applied to the second voltage booster circuit 608.

In operation, the $\phi_1$ clock signal is applied to a first voltage doubler circuit 500a of the first voltage booster circuit 606. In response thereto, the first voltage doubler circuit 500a generates an output voltage on both the rising and falling edge of $\phi_1$ ($2V_{CC}-V_{TH}-V_{CE}$ as described previously with reference to FIG. 5) that is applied to a first node 610, to a first terminal of a first capacitor bank 416a and to a first transmission BJT 612 (e.g., a diode configured BJT). Simultaneously therewith, the $\phi_2$ clock signal is applied to the output of a first boosting inverter 614, and the output of the first boosting inverter 614 is applied to the second terminal of the capacitor bank 416a. When the $\phi_2$ clock signal is high, the output of the first boosting inverter 614 and the second terminal of the first capacitor bank 416a coupled thereto are low. During this time, the first capacitor bank 416a is charged to the voltage of the first node 610 as set by the first voltage doubler circuit 500a (e.g., $2V_{CC}-V_{TH}-V_{CE}$). The voltage of the first node 610 is insufficient to turn ON the first transmission BJT 612. Thereafter, when the $\phi_2$ clock signal switches from a logic high to a logic low, the output of the first boosting inverter 614 and the second terminal of the first capacitor bank 416a coupled thereto are driven high. In response thereto, the first node 610 is raised to $3V_{CC}-V_{TH}-V_{CE}$, the first transmission BJT 612 is turned ON and the voltage on the first node 610 (e.g., the charge stored by the first capacitor bank 416a) is transferred to the output of the two stage voltage booster 600, with an additional voltage drop due to the first transmission BJT 612 ($V_{612}$) The first voltage booster circuit 606 therefore outputs a voltage of $3V_{CC}-V_{CE}-V_{TH}-V_{612}$ between times $t_1$ and $t_2$ and times $t_3$ and $t_4$ (FIG. 6B).

The second voltage booster circuit 608 similarly comprises a second voltage doubler circuit 500b, a second transmission BJT 616, a second capacitor bank 416b and a second boosting inverter 618. The input of the second voltage doubler circuit 500b and the input of the second boosting inverter 618 are driven by $b\phi_1$ and $b\phi_2$, respectively, so that the second voltage booster circuit 608 operates identically to the first voltage booster circuit 606 with the exception that the second voltage booster circuit 608 outputs a voltage of $3V_{CC}-V_{CE}-V_{TH}-V_{616}$ (where $V_{616}$ is the voltage drop due to the second transmission BJT 616) between times $t_0$ and $t_1$ and times $t_2$ and $t_3$ (FIG. 6B) rather than between times $t_1$ and $t_2$ and times $t_3$ and $t_4$. The combined outputs of the first and second voltage booster circuits 606, 608 thus result in an approximately continuous high voltage signal. Note that Schottky diodes may be employed in place of the BJT diodes within the voltage booster circuit 608 if desired.

Figure 7:
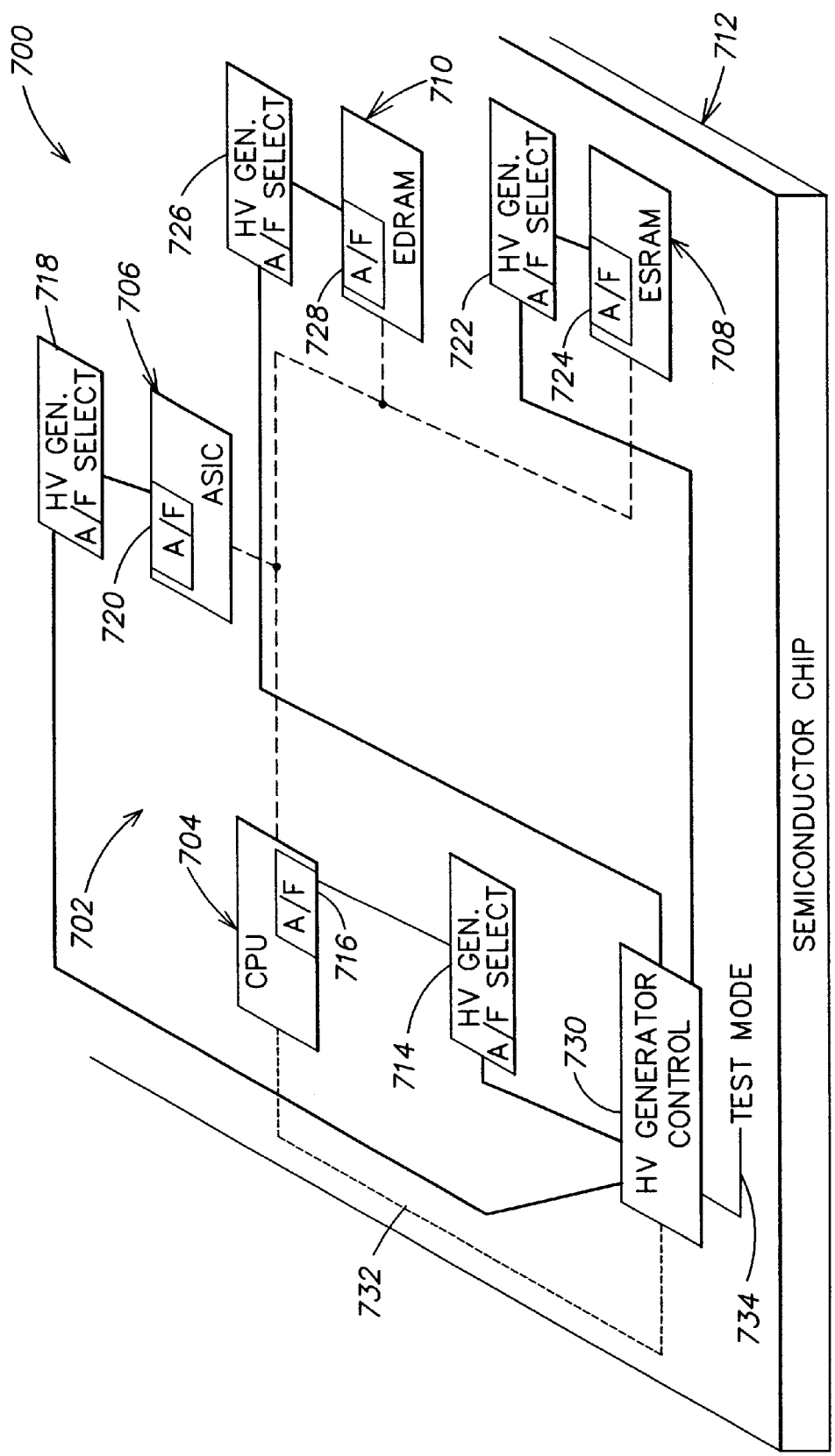
FIG. 7 is a schematic diagram of a system level optimization, trimming and defect repair scheme for a microprocessor system connected to an application specific integrated circuit (ASIC), an ESRAM and an EDRAM all formed within a single semiconductor substrate.

A significant advantage of the voltage booster circuit 400 of FIGS. 4A and 4B, and of the voltage booster circuit 600 of FIG. 6A is that both circuits employ PMOS and NMOS planar capacitors (e.g., PFET 422 and NFET 420 in FIG. 4A) connected in series with both gate electrodes connected to a common node (e.g., voltage divider node 428 in FIG. 4A) so as to avoid the parasitic capacitance that would otherwise result at the common node if either two NFETS or two PFETS were employed in series. In this manner, the outputs of the voltage booster circuits 400 and 600 are not degraded due to parasitic loading by the series connected capacitors. Another significant advantage of the voltage booster circuit 400 of FIGS. 4A and 4B, and of the voltage booster circuit 600 of FIG. 6A is that both circuits allow a voltage having a magnitude sufficient to blow an antifuse (e.g., about 8 or more volts) to be generated on the same chip as the antifuse being blown ("on-chip") using a typical power rail supply voltage (e.g., $V_{CC}$) without the need for an external high voltage signal. In this manner, no additional chip connections are required for either voltage booster circuit, and system level optimization, trimming and defect repairs (e.g., via redundant circuitry) may be easily implemented. For example, FIG. 7 is a schematic diagram of a system level optimization, trimming and defect repair scheme 700 for a microprocessor system 702 (e.g., a central processor unit (CPU) 704 connected to an application specific integrated circuit (ASIC) 706, an ESRAM 708 and an EDRAM 710 and all formed within a single semiconductor substrate 712). The system level optimization, trimming and defect repair scheme 700 comprises a first high voltage generator and antifuse select circuit (high voltage generator-A/F select circuit) 714 connected to a plurality of antifuses 716 within the CPU 704, a second high voltage generator-A/F select circuit 718 connected to a plurality of antifuses 720 within the ASIC 706, a third high voltage generator-A/F select circuit 722 connected to a plurality of antifuses 724 within the ESRAM 708, a fourth high voltage generator-A/F select circuit 726 connected to a plurality of antifuses 728 within the EDRAM 710 and a high voltage generator controller 730 connected to each of the high voltage generator-A/F select circuits 714, 718, 722 and 726. Each of the high voltage generators 714-726 preferably comprises either the voltage booster circuit 400 or the voltage booster circuit 600 and either of the antifuse write and sense circuits 108 and 300. The high voltage generator controller 730 may be controlled either locally by the CPU 704 (e.g., via a control bus 732) or remotely (e.g., via a test mode input bus 734).

In operation, the system level optimization, trimming and defect repair scheme 700 (under remote control or under control of the CPU 704) directs each high voltage generator-A/F select circuit 714, 718, 722 and 726 to blow antifuses so as to optimize the individual performance of each circuit 704, 706, 708 and 710 and/or the overall microprocessor system 702's performance, as well as to repair defective circuitry within each circuit (e.g., via the use of redundant circuitry). For example, timing and driving levels can be optimized for each circuit and/or for the system 702, variations in channel length, threshold voltage, wiring resistance/capacitance and power consumption can be compensated for, and bad bits/circuits can be replaced with functioning, redundant circuitry through selective blowing of antifuses within each circuit 704–710.

Note that for applications such as the system level optimization, trimming and defect repair scheme 700 wherein the high voltages required for blowing antifuses are generated on-chip, the use of the highly doped substrates (e.g., $5-9 \times 10^{19}$ cm$^{-3}$ p-type substrates) typically employed within high performance logic applications is not preferred because of the low breakdown voltage of n+/p junctions formed therein (e.g., n+/p junctions such as those found within the diode configured BJTs 410, 412, 418, 528, 540, 612 and 616). In such applications, a low doped substrate preferably is employed (e.g., a $5 \times 10^{15}-1 \times 10^{16}$ cm$^{-3}$ doped p-type substrate) to increase the breakdown voltages of n+/p junctions.

The foregoing description discloses only the preferred embodiments of the invention, modifications of the above disclosed apparatus and method which fall within the scope of the invention will be readily apparent to those of ordinary skill in the art. For instance, while the various devices described herein (e.g., NFET capacitors, BJT diodes, etc.) are preferred, other devices may be similarly employed (e.g., PFET capacitors, Schottky diodes, etc.).

Accordingly, while the present invention has been disclosed in connection with the preferred embodiments thereof, it should be understood that other embodiments may fall within the spirit and scope of the invention, as defined by the following claims.

The invention claimed is:

1. A method of changing the state of one of a plurality of antifuses comprising the steps of:
   selecting one of a bank of antifuses, wherein a first terminal of the selected one of the bank of antifuses is connected to a write/sense line via a selection device comprising an NFET; and
   applying a high voltage to change the state of the selected one of the bank of antifuses.

2. The method of claim 1 further comprising determining the state of the selected one of the bank of antifuses.

3. The method of claim 2 wherein determining the state of the selected one of the bank of antifuses comprises:
   applying a sense voltage across the selected one of the bank of antifuses via the write/sense line, the sense voltage having a magnitude that is insufficient to blow the selected one of the bank of antifuses;
   monitoring a current that flows through the selected one of the bank of antifuses in response to the applied sense voltage; and
   determining the state of the selected one of the bank of antifuses based on the current that flows through the selected one of the bank of antifuses.

4. The method of claim 1 wherein selecting one of the bank of antifuses comprises connecting the first terminal of the selected one of the bank of antifuses to a first voltage terminal and wherein applying the high voltage to change the state of the selected one of the bank of antifuses comprises applying the high voltage to a second terminal of the selected one of the bank of antifuses.

5. The method of claim 4 wherein the first voltage terminal is a ground.

6. An apparatus for changing the state of one of a plurality of antifuses each having a first and a second terminal, the apparatus comprising:

a write/sense line;

a plurality of selection devices comprising a plurality of NFETs, wherein each selection device connected to the write/sense line connects to the second terminal of a different one of the plurality of antifuses and selects an antifuse by connecting the antifuse's second terminal to the write/sense line in response to a selection signal; and a high voltage signal line for connecting to the first terminal of each of the plurality of antifuses and to apply a high voltage thereto that changes the state of any selected antifuse.

7. The apparatus of claim 6 further comprising a current sensing circuit connected to the write/sense line, wherein the current sensing circuit is for monitoring a current that flows through a selected one of the plurality of antifuses when a sense voltage is applied to the high voltage signal line.

8. The apparatus of claim 6 further comprising a plurality of bias limiting devices, wherein each bias limiting device connects to the second terminal of a different one of the plurality of antifuses and connected to one of the selection devices, the plurality of bias limiting devices limits the voltage applied across the selection devices to a magnitude that is insufficient to damage the selection devices.

9. The apparatus of claim 8 wherein the bias limiting devices comprise NFETs.

10. The apparatus of claim 6 further comprising a write/sense bias circuit coupled to the write/sense line and for grounding the write/sense line so as to blow a selected antifuse via a high voltage signal applied to the high voltage signal line or to raise the write/sense line to a voltage sufficient to prevent the selected antifuse from being blown by the high voltage signal applied to the high voltage signal line.

11. An apparatus for changing the state of an antifuse having a first and a second terminal, the apparatus comprising:

a first voltage terminal;

a selection device for connecting to the second terminal of the antifuse and connected to the first voltage terminal, wherein the selection device selects the antifuse by connecting the antifuse's second terminal to the first voltage terminal in response to a selection signal;

a high voltage signal line for connecting to the first terminal of the antifuse and to apply a high voltage thereto that changes the state of the antifuse when the antifuse is selected; and a voltage sensing circuit for determining if the antifuse is blown, the voltage sensing circuit comprising:

a sense node;

a sense select circuit connected to the sense node and for connecting to the second terminal of the antifuse, the sense select circuit further for connecting the sense node to the second terminal of the antifuse in response to a first signal;

a pre-charge circuit connected to the sense node and for pre-charging the sense node in response to a second signal; and a latch circuit connected to the sense node and for latching the sense node to a predetermined voltage, wherein applying the second signal so as to pre-charge the sense node and applying the first signal so as to connect the sense node to the second terminal of the antifuse discharges the sense node only if the antifuse is blown.

12. The apparatus of claim 11 wherein the first voltage terminal is a ground.

13. The apparatus of claim 11 further comprising a one-shot pulse generator connected to the pre-charge circuit and adapted for generating the second signal in response to the first signal.

14. A method of boosting a voltage comprising the steps of:

generating a first voltage within a first stage storage mechanism of a first stage voltage booster circuit;

generating a second voltage equaling approximately twice the first voltage within a first terminal of a second stage storage and a second terminal of the second stage storage mechanism of a second stage voltage booster circuit; and generating approximately thrice the first voltage based on the second voltage of the second stage voltage booster circuit.

15. The method of claim 14 wherein generating the first voltage within the first stage storage mechanism of the first stage voltage booster circuit comprises storing approximately a power supply rail voltage within the first stage capacitor.

16. The method of claim 15 further comprising storing approximately the power supply rail voltage within the second stage capacitor.

17. The method of claim 15 wherein generating the second voltage within the first terminal of the second stage storage and the second terminal of the second stage storage mechanism of the second stage voltage booster circuit comprises transferring sufficient charge from the first stage voltage booster circuit to charge the first terminal of the second stage storage of the second stage capacitor to approximately the power supply rail voltage.

18. The method of claim 16 wherein generating the second voltage within the first terminal of the second stage storage and the second terminal of the second stage storage mechanism of the second stage voltage booster circuit further comprises transferring sufficient charge from the first stage voltage booster circuit to charge the second terminal of the second stage storage of the second stage capacitor to approximately the power supply rail voltage.

19. A voltage booster circuit comprising:

a first stage voltage booster circuit having a first, first stage storage mechanism for storing a first voltage;

a second stage voltage booster circuit connected to the first stage voltage booster circuit and having a first, second stage storage mechanism and a second, second stage storage mechanism each for storing approximately the first voltage;

a first transfer mechanism connected between the first and second voltage booster circuits and for transferring approximately twice the first voltage from the first stage voltage booster circuit to the second stage voltage booster circuit; and a second transfer mechanism connected to the second stage voltage booster circuit and for transferring approximately thrice the first voltage from the second stage voltage booster circuit.

20. The voltage booster circuit of claim 19 further comprising a voltage divider network connected across the first and second, second stage storage mechanisms and for limiting the voltage stored by each storage mechanism to approximately the first voltage.

21. The voltage booster circuit of claim 19 wherein the first, first stage storage mechanism, the first, second stage storage mechanism and the second, second stage storage mechanism comprise capacitors.

22. The voltage booster circuit of claim 19 wherein the first and second transfer mechanisms each comprise a transfer mechanism selected from the group consisting of a diode-configured bipolar junction transistor and a Schottky diode.

23. The voltage booster circuit of claim 19 wherein the first stage voltage booster circuit comprises:

a transfer device connected to the first transfer mechanism and for connecting to a power supply rail having a power supply rail voltage;

a first stage capacitor connected to the transfer device; and a first stage inverter connected to the first stage capacitor and for connecting to an oscillator output;

wherein the first stage capacitor is charged to approximately the power supply rail voltage during a first portion of an oscillator signal applied to the first stage inverter.

24. The voltage booster circuit of claim 23 wherein the second stage voltage booster circuit comprises:

a first, second stage capacitor connected to the first transfer mechanism;

a second, second stage capacitor connected to the first, second stage capacitor; and a second stage inverter connected to the second, second stage capacitor and for connecting to an oscillator output;

wherein the first and the second, second stage capacitors are each charged to approximately the power supply rail voltage by the first stage voltage booster circuit during a second portion of an oscillator signal applied to the first and second stage inverters.

25. The voltage booster circuit of claim 19 wherein the first stage voltage booster circuit further comprises a second, first stage storage mechanism for storing the first voltage.

26. The voltage booster circuit of claim 25 further comprising a plurality of said voltage booster circuits wherein the second transfer mechanisms of the plurality of voltage booster circuits are connected to provide a two-stage voltage booster circuit.

27. The voltage booster circuit of claim 19 wherein the first, second stage storage mechanism comprises a PMOS planar capacitor having a gate electrode, wherein the second, second stage storage mechanism comprises an NMOS planar capacitor having a gate electrode and wherein the gate electrode of each capacitor is coupled to a common node so as to substantially reduce the parasitic capacitance of the common node.

28. A semiconductor integrated circuit formed on a single semiconductor substrate comprising:

a central processor unit having a plurality of antifuses formed therein;

a first voltage booster circuit connected to the antifuses of the central processor unit, wherein the first voltage booster circuit is configured to blow at least one antifuse within the central processor unit in response to a first control signal;

a memory array connected to the central processor unit and having a plurality of antifuses formed therein;

a second voltage booster circuit connected to the antifuses of the memory array, wherein the second voltage booster circuit is configured to blow at least one antifuse within the memory array in response to a second control signal; and a high voltage generator controller coupled to the central processing unit and to the first and second voltage booster circuits, the high voltage generator controller generates the first and the second control signals in response to a third control signal, wherein the first and second voltage booster circuits each comprise:

a first stage voltage booster circuit having a first, first stage storage mechanism for storing a first voltage;

a second stage voltage booster circuit connected to the first stage voltage booster circuit and having a first, second stage storage mechanism and a second, second stage storage mechanism each for storing approximately the first voltage;

a first transfer mechanism connected between the first and second voltage booster circuits and for transferring approximately twice the first voltage from the first stage voltage booster circuit to the second stage voltage booster circuit; and a second transfer mechanism connected to the second stage voltage booster circuit and for transferring approximately thrice the first voltage from the second stage voltage booster circuit.

29. A method of changing the state of one of a plurality of antifuses comprising the steps of:

selecting one of a bank of antifuses;

applying a high voltage to change the state of the selected one of the bank of antifuses; and determining the state of the selected one of the bank of antifuses comprising the steps of:

pre-charging a node to a pre-determined node voltage;

connecting the selected one of the bank of antifuses between the node and a first voltage terminal;

monitoring the node voltage; and determining the state of the selected one of the bank of antifuses based on the monitored node voltage.

30. The method of claim 29 wherein the first voltage terminal comprises a ground.

31. An apparatus for changing the state of one of a plurality of antifuses each having a first and a second terminal, the apparatus comprising:

a write/sense line;

a plurality of selection devices, each selection device connected to the write/sense line for connecting to the second terminal of a different one of the plurality of antifuses and to select an antifuse by connecting the antifuse's second terminal to the write/sense line in response to a selection signal;

a high voltage signal line for connecting to the first terminal of each of the plurality of antifuses and to apply a high voltage thereto that changes the state of a selected one of the plurality of antifuses; and a current sensing circuit connected to the write/sense line, wherein the current sensing circuit is for monitoring a current that flows through the selected one of the plurality of antifuses when a sense voltage is applied to the high voltage signal line.

32. The apparatus of claim 31 further comprising a plurality of bias limiting devices, wherein each bias limiting device connects to the second terminal of a different one of the plurality of antifuses and connected to one of the selection devices, the plurality of bias limiting devices limits the voltage applied across the selection devices to a magnitude that is insufficient to damage the selection devices.

33. The apparatus of claim 31 wherein the bias limiting devices comprise NFETs.

34. The apparatus of claim 31 further comprising a write/sense bias circuit coupled to the write/sense line and for grounding the write/sense line so as to blow a selected antifuse via a high voltage signal applied to the high voltage signal line or to raise the write/sense line to a voltage sufficient to prevent the selected antifuse from being blown by the high voltage signal applied to the high voltage signal line.

* * * * *